(12) United States Patent
Yu et al.

(10) Patent No.: US 7,789,537 B2
(45) Date of Patent: Sep. 7, 2010

(54) LED

(75) Inventors: Fang-Xiang Yu, Shenzhen (CN); Shun-Yuan Jan, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 188 days.

(21) Appl. No.: 12/248,010

(22) Filed: Oct. 8, 2008

(65) Prior Publication Data
US 2010/0039825 A1 Feb. 18, 2010

(30) Foreign Application Priority Data
Aug. 13, 2008 (CN) .................... 2008 1 0303723

(51) Int. Cl.
*F21V 5/00* (2006.01)
(52) U.S. Cl. .................. 362/326; 362/334; 362/336; 362/310; 257/98; 257/100
(58) Field of Classification Search ................ 362/326, 362/327, 329, 310, 311.02, 296.05, 296.07; 257/98, 100
See application file for complete search history.

(56) References Cited

U.S. PATENT DOCUMENTS

| | | | | | |
|---|---|---|---|---|---|
| 3,760,237 | A | * | 9/1973 | Jaffe | 257/98 |
| 4,603,496 | A | * | 8/1986 | Latz et al. | 40/547 |
| 5,924,785 | A | * | 7/1999 | Zhang et al. | 362/241 |
| 6,974,234 | B2 | * | 12/2005 | Galli | 362/294 |
| 7,049,740 | B2 | * | 5/2006 | Takekuma | 313/501 |
| 2005/0058162 | A1 | * | 3/2005 | Nomura et al. | 372/9 |

\* cited by examiner

*Primary Examiner*—Ali Alavi
(74) *Attorney, Agent, or Firm*—Frank R. Niranjan

(57) ABSTRACT

An LED (10) includes a chip with a light-emitting surface (140) and an encapsulation on the chip. The encapsulation has a light output surface (110) facing the light-emitting surface of the chip and has a convex surface (112) surrounding a concave surface (114). A portion of light (30) emitted by the light-emitting surface is refracted divergently via the concave surface to a predetermined area above and around the concave surface, and another portion of light (40) emitted by the light-emitting surface is refracted convergently via the convex surface to the predetermined area.

11 Claims, 4 Drawing Sheets

LED

BACKGROUND

1. Field of the Invention

The disclosure generally relates to an illumination device, and particularly to an LED which can direct light towards a predetermined area.

2. Description of Related Art

With the continuing development of scientific technology, light-emitting diodes (LEDs) have been widely used in illumination devices to substitute for conventional cold cathode fluorescent lamps (CCFL) due to their high brightness and long life-span.

In a common lamp incorporating the LED, a lens covering the LED requires a complicated shape so as to direct light generated by the LED in a predetermined direction according to need. However, the complicated lens increases the cost of the lamp.

What is needed, therefore, is an LED which can direct light towards a predetermined area with low cost.

SUMMARY

An LED according to an exemplary embodiment includes a chip and an encapsulation. The chip has a light-emitting surface. The encapsulation is disposed on the chip. The encapsulation has a light output surface facing the light-emitting surface of the chip. The light output surface includes a convex surface and a concave surface surrounded by the convex surface. A portion of light emitted by the light-emitting surface, is refracted divergently via the concave surface to a predetermined area located above and around the concave surface. Another portion of light emitted by the light-emitting surface is refracted convergently via the convex surface to the predetermined area.

Other advantages and novel features of the disclosure will become more apparent from the following detailed description of an embodiment/embodiments when taken in conjunction with the accompanying drawings.

DETAILED DESCRIPTION

Figure 1:
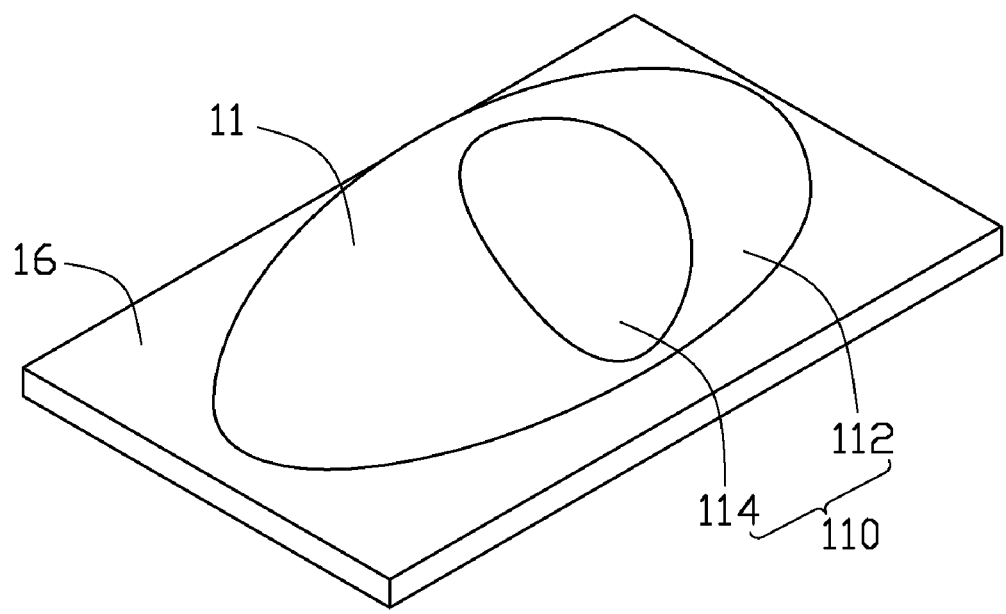
FIG. 1 is an isometric view of an LED in accordance with an exemplary embodiment of the disclosure.
Figure 2:
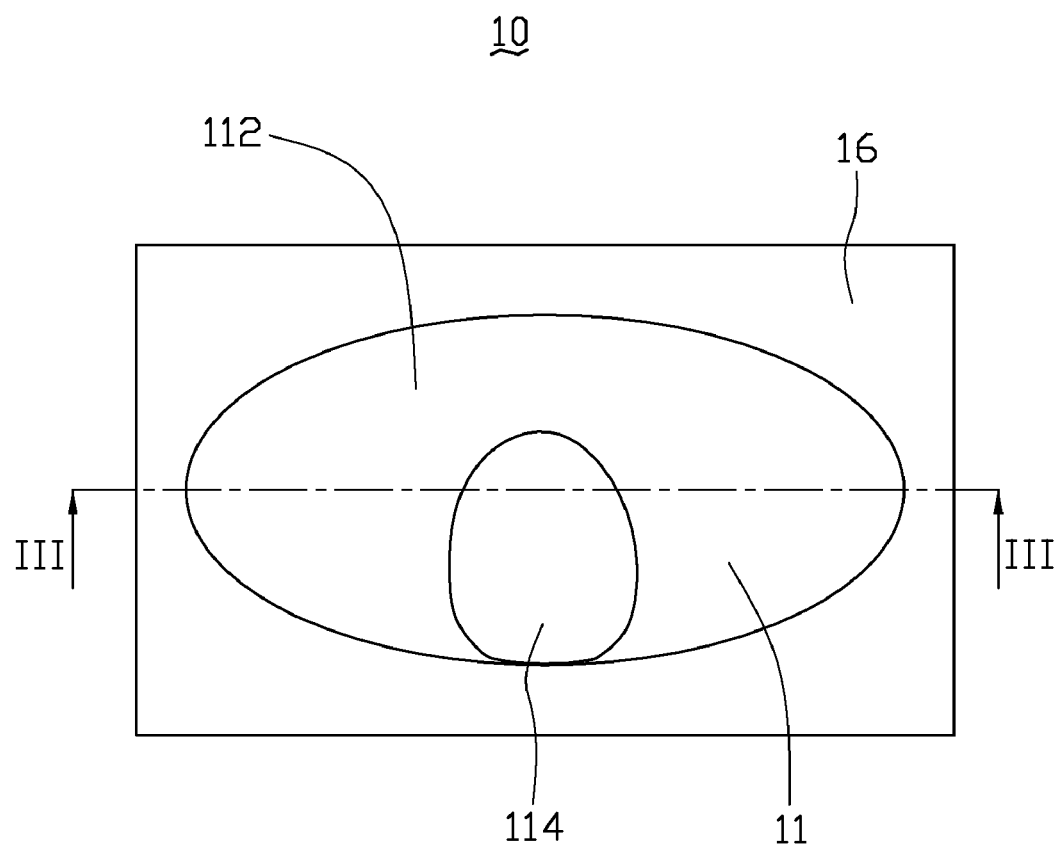
FIG. 2 is a top plan view of the LED shown in FIG. 1.
Figure 3:
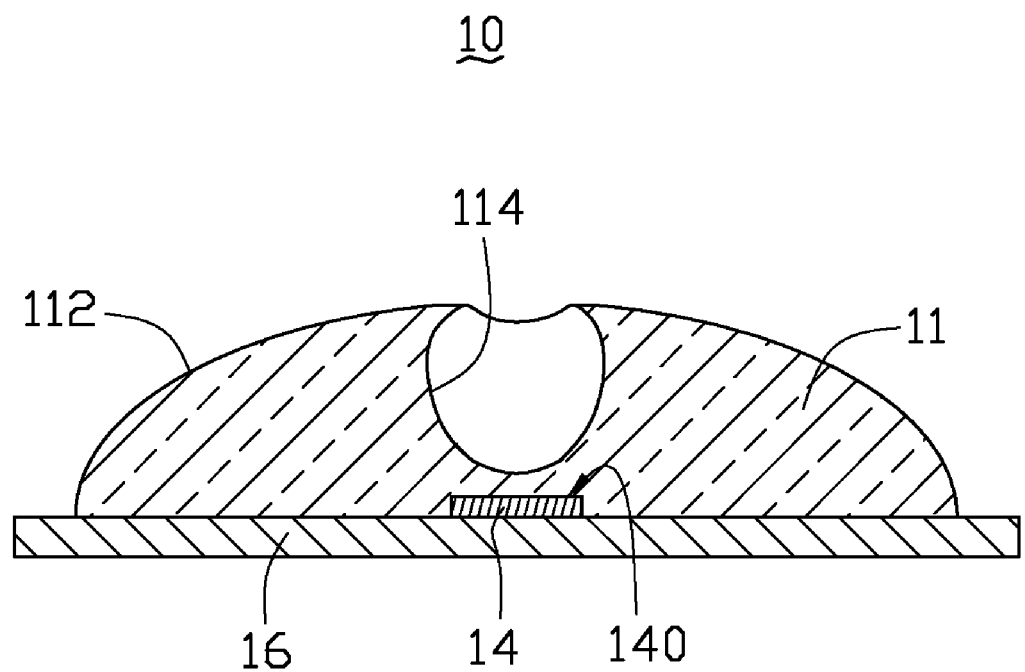
FIG. 3 is a cross-section of the LED shown in FIG. 2, taken along a line III-III thereof.

Referring to FIGS. 1-3, an LED 10 in accordance with an exemplary embodiment of the disclosure is shown. The LED 10 includes an encapsulation 11, a chip 14, and a substrate 16. The chip 14 is attached to the substrate 16. The encapsulation 11 is disposed on the substrate 16 covering the chip 14.

The encapsulation 11 has an elongated configuration along a longitudinal axis of the substrate 16. The encapsulation 11 includes a light output surface 110 on a top thereof. The light output surface 110 includes a convex surface 112 surrounding a concave surface 114. The convex surface 112 is elongated along the longitudinal axis of the substrate 16 and protrudes upwardly from a peripheral portion of the convex surface 112 towards a central portion of the convex surface 112. The convex surface 112 has a semi-ellipsoidal contour. The concave surface 114 is formed after a concave groove is defined in the convex surface 112. The concave surface 114 is located in a middle of the convex surface 112 and adjacent to a lateral side of the convex surface 112. The concave surface 114 has an elongated contour extending along a transverse axis perpendicular to the longitudinal axis of the substrate 16. Thus, the convex surface 112 is located around the concave surface 114.

The substrate 16 has an elongated, rectangular shape. The substrate 16 is located at a bottom of the LED 10 supporting the chip 14 and the encapsulation 11. Alternatively, the substrate 16 can be elliptical. The substrate 16 may be a circuit board. The LED 10 can be fixed to an illuminating device via the substrate 16.

The chip 14 is located at a bottom of the encapsulation 11. The chip 14 has a light-emitting surface 140 on a top thereof. The light-emitting surface 140 faces the light output surface 110 of the encapsulation 11. The chip 14 is adjacent to and below the concave surface 114. In this embodiment, the chip 14 is just under the concave surface 114.

Figure 4:
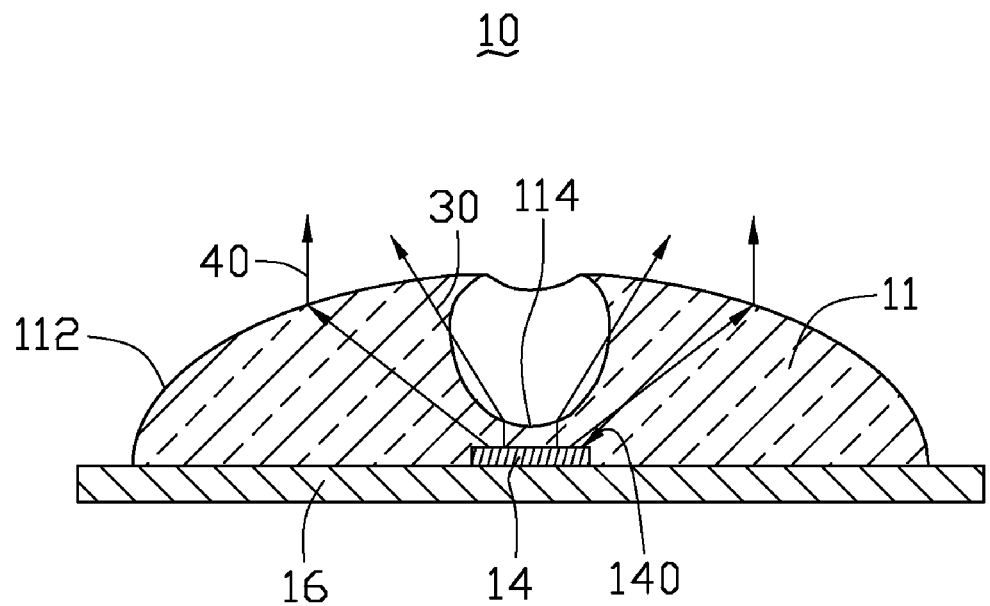
FIG. 4 is similar to FIG. 3, but shows a light path of light emitted from a chip of the LED.

Referring to FIG. 4, in operation, light is emitted from the light-emitting surface 140 of the chip 14, into the encapsulation 11, and out of the LED 10 through the light output surface 110. A portion of light 30 incident on the concave surface 114 is refracted divergently to a predetermined area located above and around the concave surface 114. Another portion of light 40 incident on the convex surface 112 is refracted convergently to the predetermined area above and around the concave surface 114. Thus, most of light generated by the chip 14 is directed towards and uniformly dispersed over the predetermined area above and around the concave surface 114 via the surfaces 112, 114. Accordingly, a lens in a lamp for directing light of the LED 10 can be omitted so that the cost of the lamp can be decreased.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED comprising:
    a chip comprising a light-emitting surface;
        an encapsulation disposed on the chip and comprising a light output surface facing the light-emitting surface, the light output surface comprising a convex surface surrounding a concave surface, wherein
        a portion of light emitted by the light-emitting surface is refracted divergently via the concave surface to a predetermined area above and around the concave surface, and another portion of light emitted by the light-emitting surface is refracted convergently via the convex surface to the predetermined area.

2. The LED as claimed in claim 1, wherein the convex surface of the encapsulation is elongated and upwardly curved and protrudes upwardly from a peripheral portion of the convex surface towards a central portion of the convex surface.

3. The LED as claimed in claim 2, wherein the convex surface is semi-ellipsoidal.

4. The LED as claimed in claim 2, wherein the concave surface of the encapsulation is formed after a concave groove is defined in the convex surface, the concave surface being elongated along an axis perpendicular to a longitudinal axis of the convex surface.

5. The LED as claimed in claim 1, wherein the concave surface of the encapsulation is in a middle of the convex surface and adjacent to a lateral side of the convex surface.

6. The LED as claimed in claim 1, wherein the chip is adjacent to and below the concave surface of the encapsulation.

7. The LED as claimed in claim 1, further comprising a substrate at a bottom of the LED supporting the chip and the encapsulation.

8. The LED as claimed in claim 7, wherein the substrate is a circuit board.

9. An LED, comprising:
   a substrate;
   a chip disposed on the substrate; and
   an encapsulation disposed on the chip, the encapsulation comprising a convex surface and a concave surface in and surrounded by the convex surface, and wherein the chip is under the concave surface, and a portion of light from the chip is refracted divergently via the concave surface to an area above the concave surface, and another portion of light of the chip is refracted convergently via the convex surface to the area above the concave surface.

10. The LED as claimed in claim 9, wherein the convex surface is semi-ellipsoidal and elongated along a first axis, and the concave surface is elongated along a second axis perpendicular to the first axis.

11. The LED as claimed in claim 10, wherein the concave surface is in a middle of and adjacent to a lateral side of the convex surface.

\* \* \* \* \*